(12) United States Patent
Wang

(10) Patent No.: US 11,373,918 B2
(45) Date of Patent: Jun. 28, 2022

(54) PLANAR PASSIVATION LAYERS

(71) Applicant: Taiwan Semiconductor Manufacturing Co., Ltd., Hsin-Chu (TW)

(72) Inventor: Po-Shu Wang, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 110 days.

(21) Appl. No.: 16/851,834

(22) Filed: Apr. 17, 2020

(65) Prior Publication Data

US 2020/0243412 A1 Jul. 30, 2020

Related U.S. Application Data

(62) Division of application No. 15/689,257, filed on Aug. 29, 2017, now Pat. No. 10,665,521.

(51) Int. Cl.
| | |
|---|---|
| *H01L 21/322* | (2006.01) |
| *H01L 23/31* | (2006.01) |
| *H01L 23/29* | (2006.01) |
| *H01L 23/535* | (2006.01) |
| *H01L 21/02* | (2006.01) |
| *H01L 21/768* | (2006.01) |
| *H01L 21/3105* | (2006.01) |

(52) U.S. Cl.
CPC ........ *H01L 23/3171* (2013.01); *H01L 21/022* (2013.01); *H01L 21/0217* (2013.01); *H01L 21/02131* (2013.01); *H01L 21/02164* (2013.01); *H01L 21/31055* (2013.01); *H01L 21/76805* (2013.01); *H01L 21/76819* (2013.01); *H01L 21/76895* (2013.01); *H01L 23/291* (2013.01); *H01L 23/3192* (2013.01); *H01L 23/535* (2013.01)

(58) Field of Classification Search
CPC ............. H01L 23/3171; H01L 21/0217; H01L 21/3171; H01L 21/02131; H01L 21/02164; H01L 21/022; H01L 21/31055
See application file for complete search history.

(56) References Cited

U.S. PATENT DOCUMENTS

| | | |
|---|---|---|
| 6,103,601 A | 8/2000 | Lee |
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Samuel A Gebremariam
(74) *Attorney, Agent, or Firm* — Duane Morris LLP

(57) ABSTRACT

A semiconductor device includes: a protruding conductive structure that protrudes to a height from a first surface of the semiconductor device; and a first passivation layer, the first passivation layer overlaying the protruding conductive structure by a first thickness, the first passivation layer overlaying the first surface by a second thickness greater than the first thickness, wherein the first passivation layer is planar at a top surface over the first thickness and the second thickness.

20 Claims, 7 Drawing Sheets

(56) References Cited

U.S. PATENT DOCUMENTS

| | | |
|---|---|---|
| 9,496,189 B2 | 11/2016 | Yu et al. |
| 2002/0123247 A1* | 9/2002 | Zuhoski .............. H01L 21/3003 |
| | | 438/791 |
| 2003/0209805 A1 | 11/2003 | Choi |
| 2009/0261434 A1 | 10/2009 | Kang |
| 2016/0020181 A1 | 1/2016 | Yu |
| 2017/0062308 A1* | 3/2017 | Choi .................... H01L 23/528 |

\* cited by examiner

PLANAR PASSIVATION LAYERS

CROSS-REFERENCE TO RELATED APPLICATION

This application is a division of U.S. patent application Ser. No. 15/689,257, filed Aug. 29, 2017, which is incorporated by reference herein in its entirety.

BACKGROUND

The semiconductor industry has made significant advancements in its pursuit of higher device density with lower cost. Technological advances in semiconductor device, or integrated circuit (IC), materials and design have produced progressively smaller and more complex circuits. In the course of semiconductor device evolution, functional density (for example, the number of interconnected devices per chip area) has generally increased while geometry sizes have decreased. This scaling down process generally provides benefits by increasing production efficiency and lowering associated costs However, increased functional density has increased the complexity of semiconductor devices, such as by decreasing the distance between interconnected layers and devices on a semiconductor device and the amount of material used to constitute the various devices and layers. This may result in semiconductor devices become more fragile as functional density increases, especially when handling or packaging semiconductor devices. Accordingly, there may be a greater chance of failures per chip area during semiconductor processing.

Therefore, conventional semiconductor device fabrication and processing are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
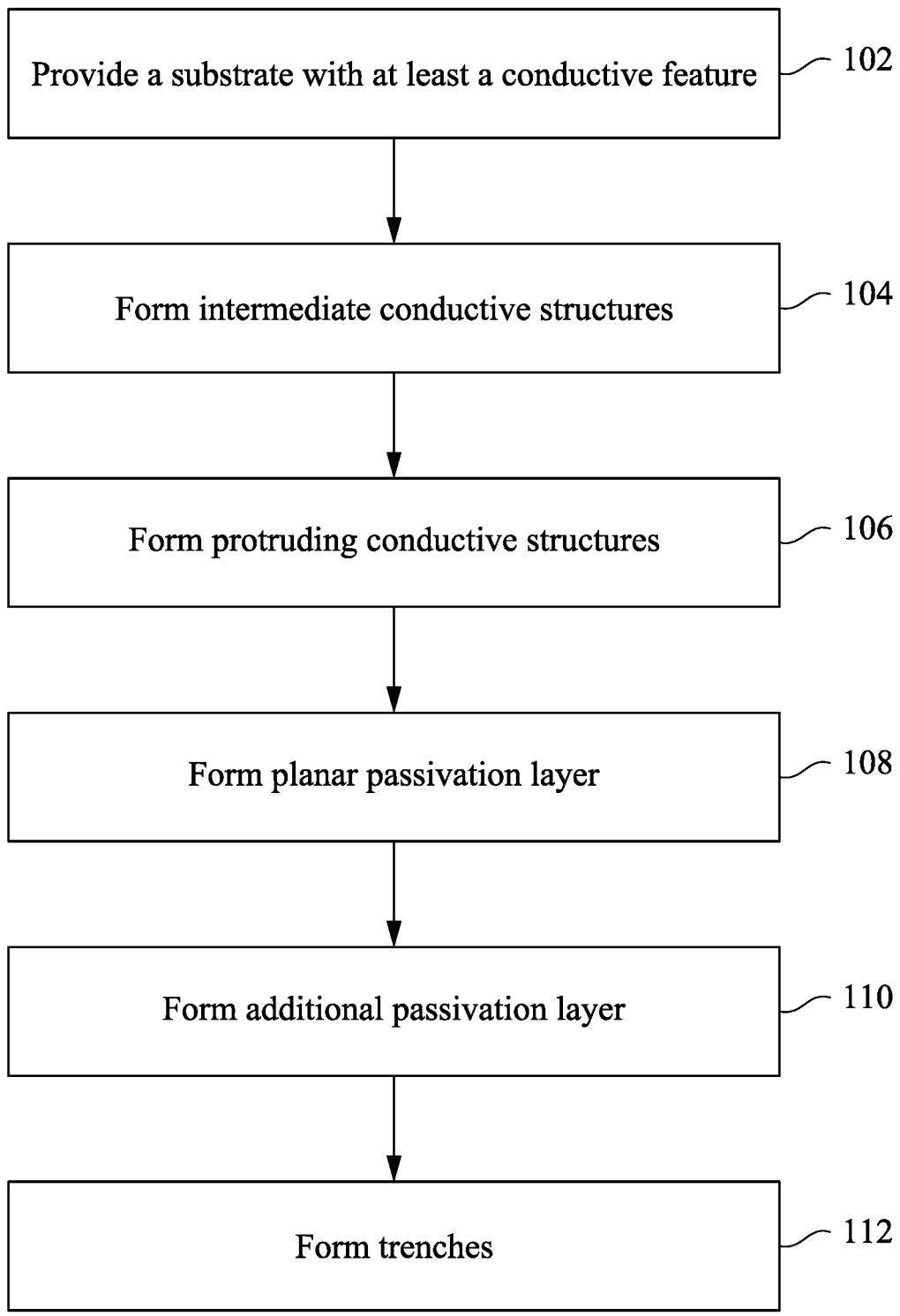
FIG. 1 illustrates a flow chart of an exemplary method for forming a semiconductor device including planar passivation layers, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device with a planar passivation layer. A passivation layer may be a protective layer or coating formed on an overlayable surface of a semiconductor device to protect the semiconductor device during handling or packaging. An overlayable surface of a semiconductor device may be any surface of the semiconductor device that may be overlaid with a passivation layer. Examples of overlayable surfaces will be discussed below at least in connection with FIG. 2D. Passivation layers may be part of the semiconductor device and may protect a semiconductor device from various stressors, such as compression, moisture, heat, shear forces, damaging mediums (e.g., damaging chemicals or gases) or any other externally inducible damage to a semiconductor device.

Typically, passivation layers may be conformal to an overlayable surface of a semiconductor device as a thin layer formed conformally atop a semiconductor device. Semiconductor devices may include non-planar structures, such as structures that protrude from or that depress into an overlayable surface of the semiconductor device (e.g., portions of the overlayable surface higher or lower than other areas of the overlayable surface). These non-planar structures may include protruding conductive structures (e.g., conductive structures that protrude from a semiconductor device, discussed further below) that facilitate semiconductor device packaging, or interfacing between different semiconductor devices or between a semiconductor device and another electronic device. However, weak points along the passivation layer may be present when a passivation layer is conformal with a semiconductor device with non-planar structures. For example, conformal passivation layers may include non-planar features (such as protrusions, depressions and transitions to or from protrusions and depressions such as corners) along the passivation layer where non-planar structures protrude from or recess into the surface of the semiconductor device. The passivation layer at these non-planar features may have weak points that incur greater stress as stressors may be more concentrated at these non-planar features (due to a variety of factors such as greater shear forces, greater compression forces, greater concentration of the stressor, or greater surface area exposed to the stressor) than at other locations of the passivation layer that are planar. Stated another way, an overlayable surface of the semiconductor device may have non-planar structures while a conformal passivation layer overlaying (e.g., coating) the non-planar structures may have non-planar features (and associated weak points) in virtue of the overlaid non-planar structures.

Accordingly, systems and methods in accordance with various embodiments describe planar passivation layers that may be formed on a semiconductor device with non-planar structures (i.e., planar passivation layers that may be formed even if the overlayable semiconductor device surface includes protrusions, depressions and transitions to or from protrusions and depressions such as corners). These planar passivation layers may include a thickness (e.g., a planarization thickness) from the overlayable surface of the semiconductor device that is sufficient for a planarization process to planarize (e.g., make flat, or planar) the surface of the passivation layer over non-planar structures and produce a planar passivation layer. Additionally, the planar passivation layer may be formed in place of, or to replace, a first formed conformal passivation layer (e.g., the lowest conformal passivation layer formed over an overlayable semiconductor device surface on which other passivation layers are formed) over non-planar structures. Accordingly, additional passivation layers formed on top of the planar passivation layer may also be planar and without weak points due to non-planar features.

In certain embodiments, the passivation layer may be formed across the semiconductor device except where exposure of the overlayable semiconductor surface (which may include a non-planar structure) would be advantageous, such as for protruding, recessed, or other contact based interconnects that may be utilized during semiconductor device packaging. Accordingly, passivation layers may have an opening (e.g., due to being etched through or not formed at certain locations) to expose an underlying overlayable semiconductor surface (which may include a non-planar structure) to facilitate various functionalities such as semiconductor device packaging. However, the planar passivation layer over the remaining surface of the semiconductor device that is not exposed for a functional purpose may be rendered planar and without weak points.

Accordingly, a planar passivation layer may advantageously not have non-planar features which, as discussed above, may be weak points along a passivation layer more susceptible to stressors that would be present on a conformal passivation layer overlaying the non-planar structures of the semiconductor device.

FIG. 1 illustrates a flowchart of a method 100 to form a semiconductor device with a planar passivation layer according to one or more embodiments of the present disclosure. It is noted that the method 100 is merely an example, and is not intended to limit the present disclosure. Accordingly, it is understood that additional operations may be provided before, during, and after the method 100 of FIG. 1, certain operations may be omitted, and some other operations may only be briefly described herein.

In some embodiments, operations of the method 100 may be associated with the cross-sectional views of a semiconductor device at various fabrication stages as shown in FIGS. 2A, 2B, 2C, 2D, 2E, and 2F respectively, which will be discussed in further detail below.

Referring now to FIG. 1, the method 100 starts with operation 102 in which a semiconductor substrate with at least a conductive feature is provided. The method 100 continues to operation 104 where intermediate conductive structures are formed. The method 100 continues to operation 106 where non-planar structures, such as protruding conductive structures, are formed. The method 100 continues to operation 108 where a planar passivation layer is formed. The method 100 continues to operation 110 where additional passivation layer(s) are formed. The method 100 continues to operation 112 where trenches are formed through the passivation layers.

As mentioned above, FIG. 2A through FIG. 2G illustrate, in a cross-sectional view, a portion of a semiconductor device 200 at various fabrication stages of the method 100 of FIG. 1. The semiconductor device 200 may include, be included in, or be a microprocessor, memory cell, wafer, and/or other integrated circuit (IC). Also, FIGS. 2A through 2G are simplified for a better understanding of the concepts of the present disclosure. For example, although the figures illustrate the semiconductor device 200, it is understood the IC may comprise a number of other devices such as resistors, capacitors, inductors, fuses, etc., which are not shown in FIGS. 2A-2G, for purposes of clarity of illustration.

Figure 2A:
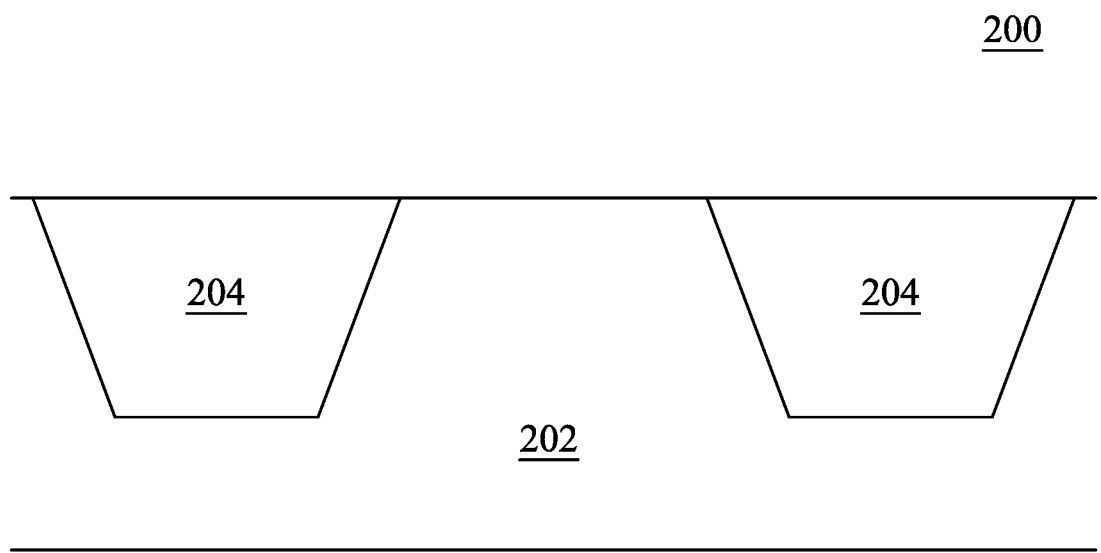
FIGS. 2A, 2B, 2C, 2D, 2E, and 2F illustrate cross-sectional views of an exemplary semiconductor device during various fabrication stages, made by the method of FIG. 1, in accordance with some embodiments.

FIG. 2A is a cross-sectional view of the semiconductor device 200 including a substrate 202 with two conductive features 204 at one of the various stages of fabrication corresponding to operation 102 of FIG. 1, in accordance with some embodiments. Although the semiconductor device 200 in the illustrated embodiment of FIG. 2A includes only two conductive features (e.g., 204), it is understood that the illustrated embodiment of FIG. 2A and the following figures are merely provided for illustration purposes. Thus, the semiconductor device 200 may include any desired number of conductive features while remaining within the scope of the present disclosure.

In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate 202 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 may further include other active devices, or functional features, such as a resistor or a capacitor formed in and on the substrate. The substrate 202 further include lateral isolation features provided to separate various devices formed in the substrate 202. In one embodiment, shallow trench isolation (STI) features are used for lateral isolation. The various devices further include silicide disposed on S/D, gate and other device features for reduced contact resistance when coupled to output and input signals.

In an embodiment, the conductive features 204 may be a source, drain or gate electrode of a transistor device. Alternatively, the conductive features 204 may be a silicide feature disposed on a source, drain or gate electrode. The silicide feature may be formed by a self-aligned silicide (typically known as "silicide") technique. In another embodiment, the conductive features 204 may include an electrode of a capacitor or one end of a resistor.

As will be discussed in further below, the semiconductor device 200 may be formed, or processed, on a layer-by-layer basis, where each layer is deposited and patterned on a preceding layer. These layers (and at least one substrate on which the layers are formed) may include various conductive elements, such as conductive features 204 (e.g., doped wells, voltage sources, or other active devices) that are interconnected via conductive structures (e.g., vias or conductive lines). Stated another way, conductive elements include conductive features 204 and conductive structures, and conductive features are active devices within a semiconductor device that may be interconnected using conductive structures. The conductive elements may include conductive material and the layers may include non-conductive material (e.g., insulating material) which may insulate conductive elements from each other.

Figure 2B:
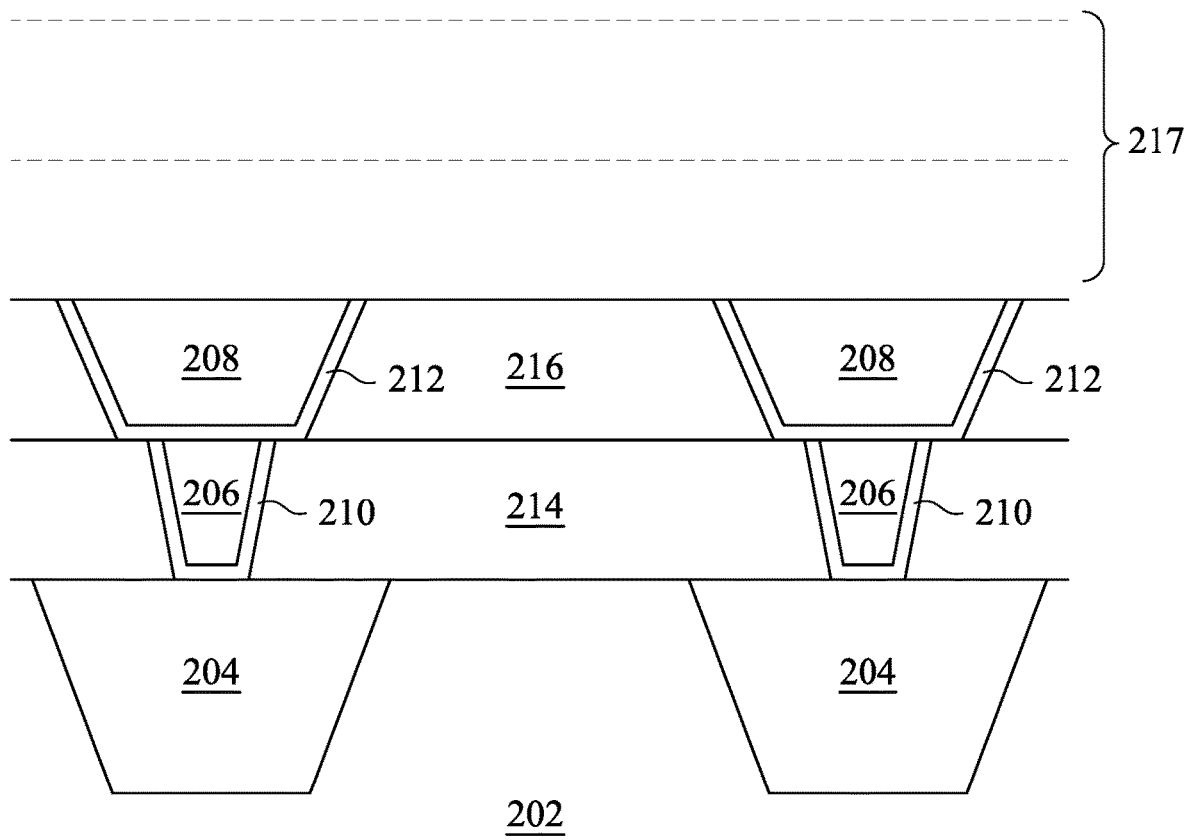

FIG. 2B is a cross-sectional view of the semiconductor device 200 including intermediate conductive structures 206, 208 at one of the various stages of fabrication that corresponds to operation 104 of FIG. 1, in accordance with some embodiments. As introduced above, conductive structures may be interconnects for conductive features (e.g., active devices in the semiconductor device). Also, both conductive structures and conductive features may be termed as conductive elements. The intermediate conductive structures may include vertical conductive structures 206 (e.g., a via) and horizontal conductive structures 208 (e.g., a conductive line). For clarity, these intermediate conductive structures are described as "intermediate" as they are between (and will facilitate a conductive path between) the conductive features 204 and the protruding conductive structures introduced above and discussed further below.

As shown, the intermediate vertical conductive structures 206 may vertically extend through isolation layer 214 to couple (e.g., conductively couple) with other conductive elements, such as conductive feature 204 and intermediate horizontal conductive structures 208. Also, as discussed further below, intermediate horizontal conductive structures 208 may horizontally extend (e.g., over a respective width) through isolation layer 216 to couple with other conductive elements, such as intermediate vertical conductive structures 206 and the protruding conductive structures (discussed further below). In some embodiments, the intermediate horizontal conductive structures 208 may be wider than the intermediate vertical conductive structures 206. In certain embodiments, the intermediate vertical conductive structures 206 adjacent to the conductive featured 204 may be a conductive plug. In some further embodiments, the semiconductor device 200 may include barrier layers 210 and 212 surrounding sidewalls and bottom surfaces of the intermediate conductive structures 206 and 208, respectively.

The isolation layers may include a non-conductive material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In some embodiments, the intermediate conductive structures 208, 206 may include conductive materials, such as a metal, or for example, copper (Cu), tungsten (W), or a combination thereof. In some other embodiments, the intermediate conductive structures 208, 206 may include other suitable conductive materials (e.g., metal materials such as gold (Au), cobalt (Co), silver (Ag), etc. and/or conductive materials (e.g., polysilicon)) while remaining within the scope of the present disclosure.

In some embodiments, the barrier layers 210, 212 may include barrier materials that enhance (e.g., improves) conductivity of conductive materials and may effectively prevent (e.g., block) metal atoms from diffusing from conductive materials into non-conductive materials during a deposition process to form conductive structures or conductive features. Examples of barrier materials include tantalum nitride (TaN), tantalum (Ta), titanium nitride (TiN), titanium (Ti), cobalt tungsten (CoW), tungsten nitride (WN), or the like.

In the following discussion, reference to conductive structures 206 and 208 may or may not include their corresponding barrier layers 210 and 212 as part of the respective conductive structure 206 and 208. In various embodiments, the barrier layer does not change the function of the respective conductive structures 206 and 208, except to enhance the material properties of the adjoining conductive structures 206 and 208.

The intermediate vertical conductive structures 206 may be formed by at least some of the following process steps: using chemical vapor deposition (CVD), physical vapor deposition (PVD), spin-on coating, and/or other suitable techniques to deposit the non-conductive material over the substrate 202 and the conductive features 204 to form an initial first isolation layer (the isolation layer is a remaining portion of the initial first isolation layer after the later performed patterning process); performing one or more patterning processes (e.g., a lithography process, a dry/wet etching process, a cleaning process, a soft/hard baking process, etc.) to form openings through the initial first isolation layer; using CVD, PVD, and/or other suitable techniques to deposit the aforementioned barrier material along a bottom surface and sidewalls of the opening to surround the openings; using CVD, PVD, E-gun, and/or other suitable techniques to fill the openings with conductive material, and polishing out excessive material to form the intermediate vertical conductive structures 206.

As shown, the intermediate horizontal conductive structures 208 horizontally extends over a respective width in the isolation layer 216. The intermediate horizontal conductive structures 208 may be conductively coupled to the intermediate vertical conductive structures 206. The intermediate horizontal conductive structures 208 may be formed by at least some of the following process steps: using CVD, PVD, spin-on coating, and/or other suitable techniques to deposit non-conductive material over the isolation layer 214 and the intermediate vertical conductive structures 206 to form an initial first isolation layer (the isolation layer 214 is a remaining portion of this initial first isolation layer after the later performed patterning process); performing one or more patterning processes (e.g., a lithography process, a dry/wet etching process, a cleaning process, a soft/hard baking process, etc.) to form openings through the initial first isolation layer; using CVD, PVD, and/or other suitable techniques to deposit the aforementioned barrier material along a bottom surface and sidewalls of the openings to surround the opening; using CVD, PVD, E-gun, and/or other suitable techniques to fill the openings with conductive material, and polishing out excessive material to form the intermediate horizontal conductive structures 208.

Although the semiconductor device 200 in the illustrated embodiment of FIG. 2B includes two intermediate conductive structures 206 and 208 within two isolation layers 214 and 216, it is understood that the illustrated embodiment of FIG. 2B and the following figures are merely provided for illustration purposes. Thus, the semiconductor device 200 may include any desired number of conductive structures within any desired number of isolation layers (including one isolation layer, one or more pairs of isolation layers, or no isolation layers) while remaining within the scope of the present disclosure. For example, in an alternate embodiment illustrated in FIG. 2B with dotted lines, two additional isolation layers 217 may be formed on top of isolation layer 216.

Figure 2C:
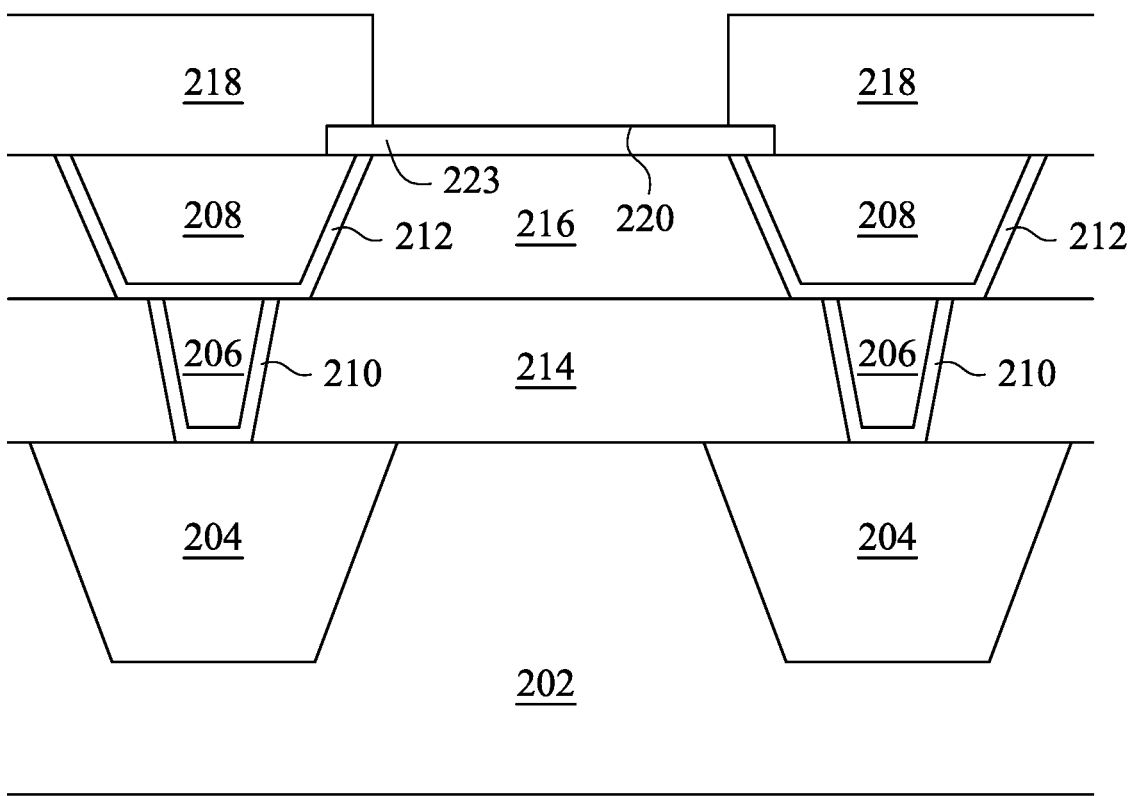

FIG. 2C is a cross-sectional view of the semiconductor device 200 including protruding conductive structures 218 at one of the various stages of fabrication that corresponds to operation 106 of FIG. 1, in accordance with some embodiments. In some embodiments, the protruding conductive structures 218 may be a conductive structure conductively coupled with the underlying intermediate horizontal conductive structures 208. The protruding conductive structures 218 may protrude away from the semiconductor device 200 relative to another surface 220 of the semiconductor device 200. As illustrated, the other surface 220 of the semiconductor device 200 is the exposed top surface of a flat conformal passivation layer 223, which is part of the semiconductor device 200. In certain embodiments, the protruding conductive structures 218 may include a barrier layer at the interface between the protruding conductive structures 218 with each of the flat conformal passivation layer 223, the intermediate conductive structure 208, intermediate isolation layer 216, and barrier layer 212.

As shown, the protruding conductive structures 218 may be a conductive structure that may be used as an interconnect with external electronic devices for semiconductor device packaging, as will be discussed further below in connection with FIG. 2F. In certain embodiments, optionally, the flat conformal passivation layer 223 may be formed prior to the formation of the planar passivation layer discussed further below. This flat conformal passivation layer 223 may be formed as an additional layer of protection on an isolation layer. This flat conformal passivation layer 223 is illustrated in FIG. 2C as overlying intermediate isolation layer 216, which is flat, and is in-between, and slightly extending into, the protruding conductive structures 218. It should be noted that this flat conformal passivation layer 223 does not overly any non-planar structures and, although conformal, would not include any non-planar features (and associated weak points) since there are no underlying non-planar structures. As discussed above, passivation layers including non-planar features may have weak points that incur greater stress as stressors may be more concentrated at these non-planar features (due to a variety of factors such as greater shear forces, greater compression forces, greater concentration of the stressor, or greater surface area exposed to the stressor) than at other locations of the passivation layer that are planar. Accordingly, the flat conformal passivation layer 223 is not a "planarized" passivation layer as the flat conformal passivation layer 223 does not overly non-planar structures. For example, the flat conformal passivation layer 223 overlays the intermediate isolation layer 216 and the intermediate conductive structure 208, which are planar with each other and, in combination, provides a planar surface on which the flat conformal passivation layer 223 may be formed. In contrast, as used herein a "planar" or "planarized" passivation layer refers to a passivation later that is formed over non-planar structures and thereafter planarized (i.e., its top surface is made flat) to form the planar passivation layer.

In particular embodiments, the flat conformal passivation layer 223 may be composed of passivation materials that protect the semiconductor device from external stressors. These passivation materials may include silicon mononitride (SiN), dielectric materials, oxides (such as Un-doped Silicate Glass USG, Fluorinated Silicate Glass FSG, or the like) or other materials that may suitably protect a semiconductor device from external stressors. Examples of some passivation materials are discussed further below. The flat conformal passivation layer 223 may be formed using CVD, PVD, E-gun, and/or other suitable techniques to deposit passivation material on the intermediate isolation layer 216, and polishing out or patterning excessive material to form the flat conformal passivation layer 223.

In certain embodiments, the protruding conductive structures 218 may be formed using CVD, PVD, E-gun, and/or other suitable techniques to deposit conductive material (e.g., deposit on the intermediate isolation layer 216 and the flat conformal passivation layer 223), and polishing out or patterning excessive material to form the protruding conductive structures 218.

In some embodiments, the protruding conductive structures 218 may include conductive materials, such as a metal, or for example, aluminum (Al), copper (Cu), tungsten (W), or a combination thereof. In some other embodiments, the protruding conductive structures 218 may include other suitable conductive materials (e.g., metal materials such as gold (Au), cobalt (Co), silver (Ag), etc. and/or conductive materials (e.g., polysilicon)) while remaining within the scope of the present disclosure.

Although the semiconductor device 200 in the illustrated embodiment of FIG. 2C includes two protruding conductive structures as non-planar structures, it is understood that the illustrated embodiment of FIG. 2C and the following figures are merely provided for illustration purposes. Thus, the semiconductor device 200 may include any desired number or type of (e.g., conductive or non-conductive) non-planar structures while remaining within the scope of the present disclosure.

Figure 2D:
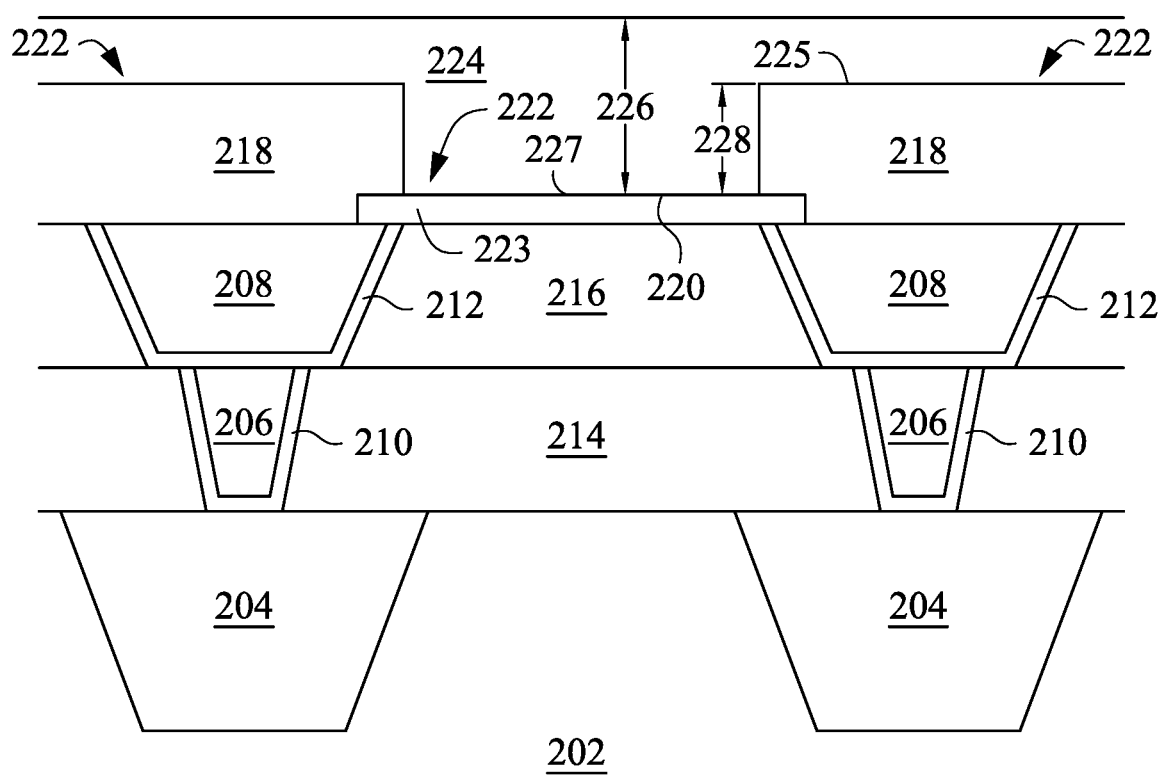

FIG. 2D is a cross-sectional view of the semiconductor device 200 including a planar passivation layer 224 at one of the various stages of fabrication that corresponds to operation 108 of FIG. 1, in accordance with some embodiments. In some embodiments, the planar passivation layer 224 may not be conformal with underlying non-planar structures, such as a depression produced by the protruding conductive structures 218 (which protrudes relative to other surfaces 220 of the overlayable semiconductor device surface 222, accordingly forming non-planar structures). As introduced above, the planar passivation layer 224 may be formed on an overlayable semiconductor device surface 222 (e.g., a surface of the semiconductor device 200 that may be overlaid with the planar passivation layer 224). For the planar passivation layer 224, the overlayable semiconductor device surface 222 (after formation of the flat passivation layer 223 and the protruding conductive structures 218, as discussed above) may include the exposed surfaces of the flat passivation layer 223 and the protruding conductive structures 218.

The planar passivation layer 224 may extend from the overlayable semiconductor device surface 222 to a planarization thickness 226 that is sufficient for a planarization process to planarize (e.g., make planar) the surface of the planar passivation layer 224 over both the protruding conductive structures 218 and the overlayable semiconductor device surface 222 (e.g., non-planar structures) to produce a planar passivation layer 224. For example, in the illustrated embodiment, the planarization thickness 226 may be at or greater than a minimum planarization thickness 228 from which a planar passivation layer may be formed. In certain embodiments, the minimum planarization thickness 228 may be a thickness from the lowest point 227 in an overlayable semiconductor device surface to a highest point 225 on an overlayable semiconductor device plus a minimum thickness of a passivation layer. In certain embodiments, the planar passivation layer 224 may be from about 1 angstroms (Å) to about 50 Å in thickness over the highest point 225 of the overlayable semiconductor device surface 222 and about 2 Å to about 40 k Å over the lowest point 227 of the overlayable semiconductor device surface 222.

In particular embodiments, the planar passivation layer 224 may be composed of passivation materials that protect the semiconductor device from external stressors. These passivation materials may include silicon mononitride (SiN), dielectric materials, oxides (such as Un-doped Silicate Glass (USG), Fluorinated Silicate Glass (FSG), or the like) or other materials that may suitably protect a semiconductor device from external stressors. These materials may be selected based upon the desired qualities of the planar passivation layer 224. For example, SiN may be a passivation material for a passivation layer that is moisture resistant and USG may be a passivation material for a passivation layer that is pressure resistant.

In various embodiments, the planarization process may include a chemical-mechanical planarization (CMP) process that polishes or smooths out material surfaces. For example, in certain embodiments, the planar passivation layer 224 may be formed using CVD, PVD, E-gun, and/or other suitable techniques to deposit passivation material at a quantity sufficient for the planar passivation layer to meet or exceed the minimum planarization thickness, and planarizing (or polishing out using a planarization process) excessive material to form the planar passivation layer 224. In certain embodiments, a planar passivation layer may be formed with a planarization thickness that greatly exceeds the minimum planarization thickness to add additional protective passivation materials to protect the semiconductor device from external stressors and to make the planar passivation layer more robust (for example, due to being composed of more material and, accordingly, to have a more substantial physical structure).

As discussed above, advantageously, a planar passivation layer may not have non-planar features which, as discussed above, may be weak points along a passivation layer more susceptible to stressors that would be present on a conformal passivation layer overlaying the non-planar structures of the semiconductor device.

Figure 2E:
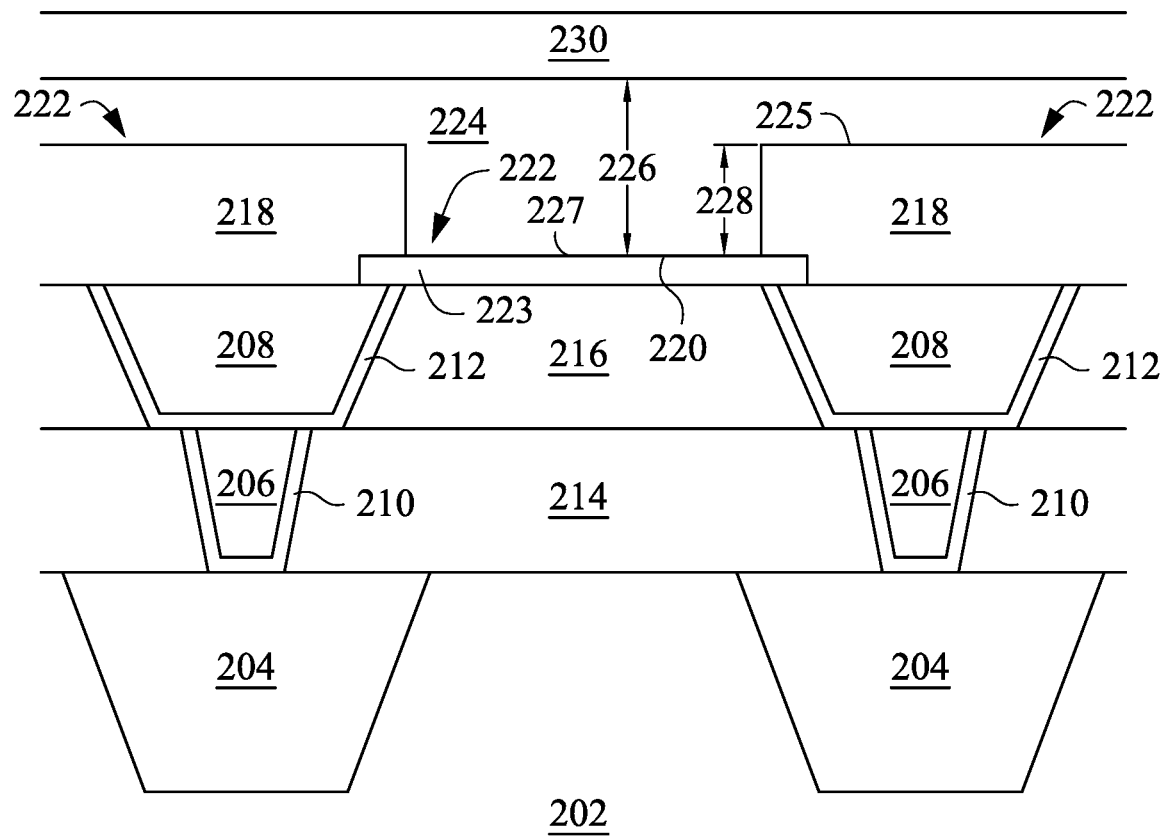

FIG. 2E is a cross-sectional view of the semiconductor device 200 including an additional passivation layer 230 at one of the various stages of fabrication that corresponds to operation 110 of FIG. 1, in accordance with some embodiments. As shown, the additional passivation layer 230 overlays the planar passivation layer 224. Accordingly, as the planar passivation layer 224 may be planar, the additional passivation layer 230 may also be planar.

In various embodiments, the additional passivation layer 230 may be formed using CVD, PVD, E-gun, and/or other suitable techniques to deposit passivation material on the planar passivation layer 224, and planarizing (or polishing out using a planarization process) excessive material to form the additional passivation layer 230. Although the semiconductor device 200 in the illustrated embodiment of FIG. 2E includes two passivation layers (the planar passivation layer 224 and the additional passivation layer 230, it is understood that the illustrated embodiment of FIG. 2E is merely provided for illustration purposes. Thus, the semiconductor device 200 may include any desired number of passivation layers while remaining within the scope of the present disclosure.

Figure 2F:
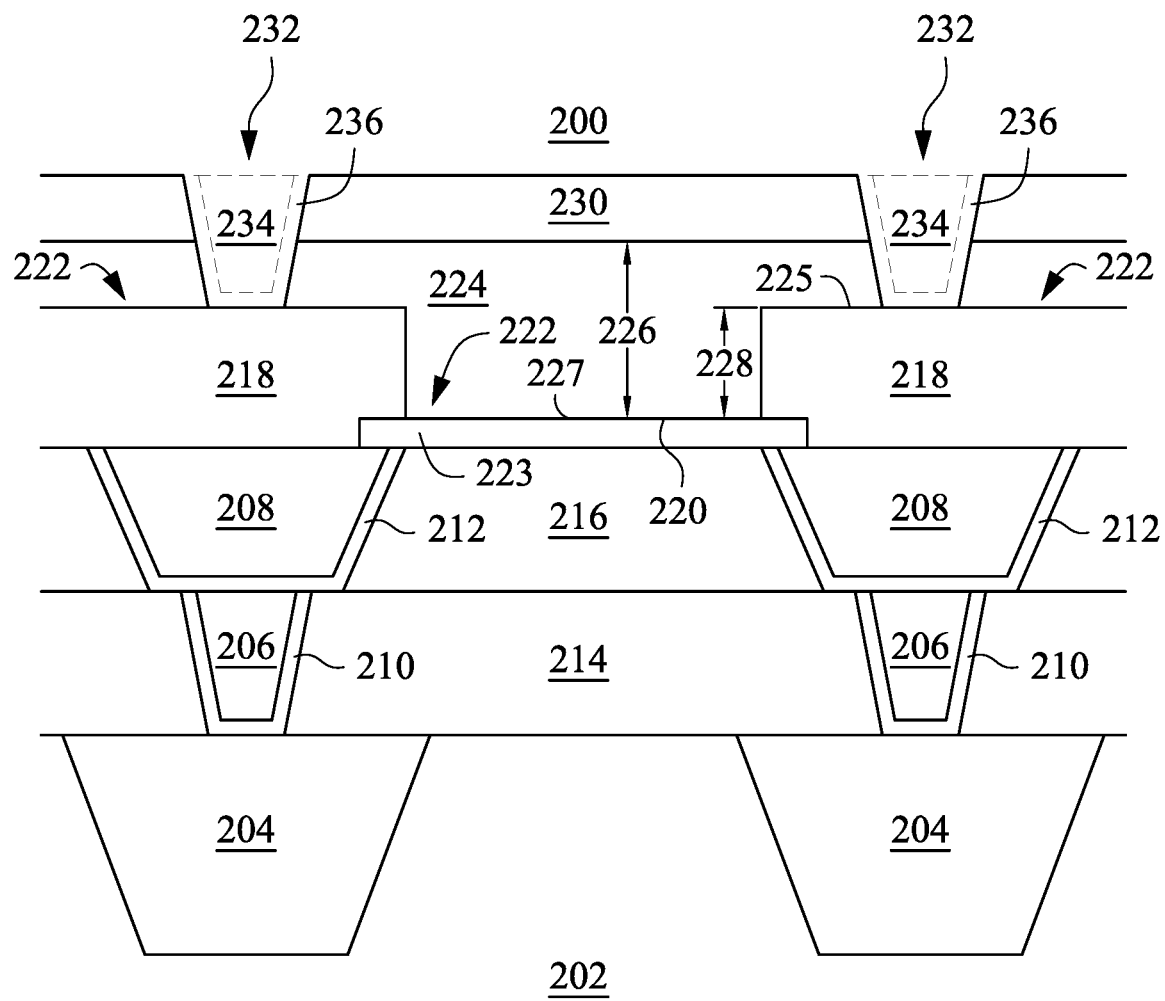

FIG. 2F is a cross-sectional view of the semiconductor device 200 including trenches 232 that extend through the passivation layers 224, 230 at one of the various stages of fabrication that corresponds to operation 112 of FIG. 1, in accordance with some embodiments. As shown the trenches 232 may be openings that extend through the passivation layers 224, 230 to expose a surface of the protruding conductive structures 218. The trenches 232 may be formed using a patterning processes (e.g., a lithography process, a dry/wet etching process, a cleaning process, a soft/hard baking process, etc.) to form the trenches 232 that extend through the passivation layers 224, 230.

In certain embodiments, trenches 232 may be filled with conductive material to form additional vertical conductive structures 234 (noted with dotted lines due to the below discussion of other embodiment of the trenches 232 left as openings) in a manner similar to how the vertical conductive structures 206 are formed (as discussed above). For example, the additional vertical conductive structures 234 may be formed by at least some of the following process steps: CVD, PVD, and/or other suitable techniques to may be used to deposit a barrier layer 236 (noted with dotted lines) made from the aforementioned barrier material along a bottom surface and sidewalls of the trenches 232 to surround the trenches 232; using CVD, PVD, E-gun, and/or other suitable techniques to fill the trenches 232 with conductive material, and polishing out excessive material to form the additional vertical conductive structures 234. These additional vertical conductive structures 234 may be used in semiconductor packaging to interface with an external electronic device (e.g., another semiconductor device) different that the semiconductor device 200, such as during semiconductor packaging.

In other embodiments, the trenches 232 may remain as openings to provide access to the protruding conductive structures 218, without forming the additional vertical conductive structures 234. For examples, the trenches 232 may be configured to receive an external conductive structure from an external electronic device (e.g., another semiconductor device) different that the semiconductor device 200, during various applications such as semiconductor packaging. By receiving the external conductive structure from the external electronic device, the protruding conductive structures 218 may be put in conductive communication with the external electronic device (e.g., for applications such as semiconductor packaging).

In an embodiment, a semiconductor device includes: a protruding conductive structure that protrudes to a height from a first surface of the semiconductor device; and a first passivation layer, the first passivation layer overlaying the protruding conductive structure by a first thickness, the first passivation layer overlaying the first surface by a second thickness greater than the first thickness, wherein the first passivation layer is planar at a top surface over the first thickness and the second thickness.

In another embodiment, a method includes: forming a structure protruding to a height from the semiconductor device surface; forming a structure protruding to a height from the semiconductor device surface; forming a passivation layer, the passivation layer overlaying the structure by a first thickness, the passivation layer overlaying the semiconductor device surface by a second thickness greater than the first thickness; and planarizing the first passivation layer.

Yet in another embodiment, a method includes: forming a conductive feature; forming a conductive structure protruding to a height from a semiconductor device surface, the conductive structure in conductive communication with the conductive feature; forming a passivation layer, the passivation layer overlaying the conductive structure by a first thickness, the passivation layer overlaying the semiconductor device surface by a second thickness that comprises the first thickness and the height; and planarizing the passivation layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method, comprising:
    forming a semiconductor device surface;
    forming a first isolation layer over the semiconductor device surface;
    forming an intermediate conductive structure in the first isolation layer, wherein a top surface of the intermediate conductive structure is coplanar with a top surface of the first isolation layer;
    forming a conductive structure protruding to a height from the semiconductor device surface, wherein the conductive structure is formed on and in contact with at least a portion of the top surface of the first isolation layer and at least a portion of the top surface of the intermediate conductive structure;
    forming a first passivation layer, the first passivation layer overlaying the conductive structure by a first thickness, the first passivation layer overlaying the semiconductor device surface by a second thickness greater than the first thickness; and
    planarizing the first passivation layer.

2. The method of claim 1, wherein the first passivation layer is planar at a top surface over the first thickness and the second thickness.

3. The method of claim 1, comprising:
    forming a second passivation layer overlaying the first passivation layer.

4. The method of claim 1, comprising:
    etching the first passivation layer overlaying the structure to form a trench, and
    filling the trench with conductive material to form another conductive structure within the trench.

5. The method of claim 4, comprising:
    conductively coupling the conductive structure with an external semiconductor device different than a semiconductor device that the conductive structure is formed on.

6. The method of claim 1, wherein the second thickness that comprises the first thickness and the height.

7. A method, comprising:
    forming a conductive feature in a substrate;
    forming a first isolation layer over a top surface of the substrate;
    forming an intermediate conductive structure in the first isolation layer, wherein a top surface of the intermediate conductive structure is coplanar with a top surface of the first isolation layer;
    forming a conductive structure protruding to a height from a semiconductor device surface, the conductive structure in conductive communication with the conductive feature, wherein the conductive structure is formed on and in contact with at least a portion of the top surface of the first isolation layer and at least a portion of the top surface of the intermediate conductive structure;
    forming a passivation layer, the passivation layer overlaying the conductive structure by a first thickness, the passivation layer overlaying the semiconductor device surface by a second thickness that comprises the first thickness and the height; and
    planarizing the passivation layer.

8. The method of claim 7, wherein the passivation layer is planar at a surface of the passivation layer over the first thickness and the second thickness.

9. The method of claim 7, comprising:
    applying a chemical-mechanical planarization process to the passivation layer.

10. The method of claim 7, comprising:
    forming an opening in the passivation layer, the opening extending from a surface of the passivation layer to the conductive structure.

11. A method, comprising:
    forming a first isolation layer over a top surface of a substrate;
    forming an intermediate conductive structure in the first isolation layer, wherein a top surface of the intermediate conductive structure is coplanar with a top surface of the first isolation layer;
    forming a protruding conductive structure on and in contact with at least a portion of the top surface of the first isolation layer and at least a portion of the top surface of the intermediate conductive structure, wherein the protruding conductive structure protrudes to a height above the top surface of the first isolation layer;

forming a first passivation layer on in direct contact with at least a portion of the top surface of the first isolation layer and at least a portion of the top surface of the intermediate conductive structure; and forming a second passivation layer on and in direct contact with and overlaying the protruding conductive structure by a first thickness, the second passivation layer in direct contact with and overlaying the first passivation layer by a second thickness greater than the first thickness, wherein the second passivation layer is planar at a top outermost surface of the semiconductor device over the first thickness and the second thickness.

12. The method of claim 11, further comprising forming an opening in the second passivation layer, the opening extending from the top outermost surface to the protruding conductive structure.

13. The method of claim 11, wherein the second passivation layer coats both the first surface and the protruding conductive structure.

14. The method of claim 11, wherein the first thickness is of a minimum amount sufficient for the second passivation layer to coat the protruding conductive structure.

15. The method of claim 11, wherein the second thickness comprises the first thickness and the height.

16. The method of claim 11, wherein the second passivation layer comprises at least one of silicon mononitride (SiN), Un-doped Silicate Glass (USG), and Fluorinated Silicate Glass (FSG).

17. The method of claim 11, further comprising:
forming a vertical conductive structure extending through the second passivation layer to conductively couple with the protruding conductive structure.

18. The method of claim 17, wherein the vertical conductive structure is in conductive communication with an external semiconductor device different than the semiconductor device.

19. The method of claim 11, comprising:
forming a conductive feature within the semiconductor device, wherein:
the protruding conductive structure is in conductive communication with the conductive feature, and
the conductive feature comprises at least one of a source, a drain, and a gate electrode of a transistor.

20. The method of claim 11, wherein the second passivation layer comprises multiple individual passivation layers.

* * * * *